United States Patent
Lin

(10) Patent No.: US 7,064,987 B2
(45) Date of Patent: Jun. 20, 2006

(54) MEMORY ADDRESS GENERATOR WITH SCHEDULED WRITE AND READ ADDRESS GENERATING CAPABILITY

(75) Inventor: Gong-Sheng Lin, Taichung (TW)

(73) Assignee: MEDIATEK, Inc., Hsinchu Hsien (TW)

( * ) Notice: Subject to any disclaimer, the term of this patent is extended or adjusted under 35 U.S.C. 154(b) by 970 days.

(21) Appl. No.: 10/117,029

(22) Filed: Apr. 4, 2002

(65) Prior Publication Data

US 2003/0189848 A1 Oct. 9, 2003

(51) Int. Cl.
*G11C 7/10* (2006.01)

(52) U.S. Cl. ............................ 365/189.01; 365/189.07; 365/236

(58) Field of Classification Search ............ 365/189.01, 365/189.04, 189.07, 189.12, 191, 194, 236; 345/519, 520, 629

See application file for complete search history.

(56) References Cited

U.S. PATENT DOCUMENTS

| 5,745,724 | A | * | 4/1998 | Favor et al. ................. 712/213 |
| 6,853,385 | B1 | * | 2/2005 | MacInnis et al. ........... 345/629 |
| 2005/0122335 | A1 | * | 6/2005 | MacInnis et al. ........... 345/520 |

* cited by examiner

*Primary Examiner*—Gene N. Auduong
(74) *Attorney, Agent, or Firm*—Christensen O'Connor Johnson Kindness PLLC

(57) ABSTRACT

A memory address generator includes a write address generator for generating write addresses to be used in writing of data units of an input data block into a memory device in a non-raster scan arrangement, a read address generator for generating read addresses to be used in reading of the data units of the input data block from the memory device in a raster scan arrangement, and a scan pattern analyzer for enabling the read address generator after enabling the write address generator such that an optimum number of the write addresses for the writing of the input data block has been generated prior to generation of the read addresses for the reading of the input data block in order to ensure that the reading of each of the data units from the memory device can lag the writing of each of the data units into the memory device.

8 Claims, 6 Drawing Sheets

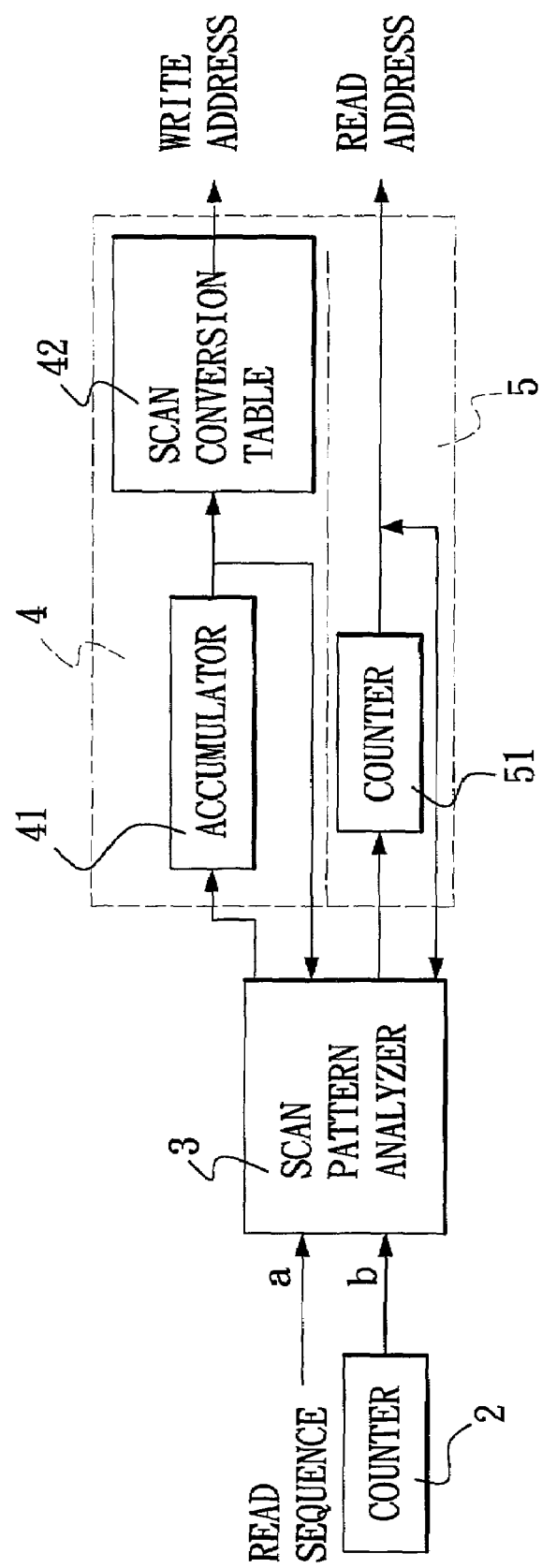
F I G. 4

FIG. 6

| WRITE SEQUENCE a | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| READ SEQUENCE b | 0 | 1 | 5 | 6 | 2 | 4 | 7 | 12 | 3 | 8 | 11 | 13 | 9 | 10 | 14 | 15 |
| DIFFERENCE a−b | 0 | 0 | −3 | −3 | 2 | 1 | −1 | −5 | 5 | 1 | −1 | −2 | 3 | 3 | 0 | 0 |

FIG. 7

| MEMORY CYCLE | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| W(0) | 0 | 1 | 2 | 3 | 4 | 5 | 6 | 7 | 8 | 9 | 10 | 11 | 12 | 13 | 14 | 15 | | | | | | |
| R(0) | | | | | | | 0 | 1 | 5 | 6 | 2 | 4 | 7 | 12 | 3 | 8 | 11 | 13 | 9 | 10 | 14 | 15 |

MEMORY ADDRESS GENERATOR WITH SCHEDULED WRITE AND READ ADDRESS GENERATING CAPABILITY

BACKGROUND OF THE INVENTION

1. Field of the Invention

The invention relates to a memory address generator, more particularly to a memory address generator with scheduled write and read address generating capability and suitable for use when rearranging data.

2. Description of the Related Art

In a known motion video encoder, data obtained after a quantization operation are rearranged via a forward scanning operation, which may be carried out using zig-zag scanning (see FIG. 1) or alternate scanning (see FIG. 2), such that zero values can be grouped in succession to enhance the data compression effect using a variable length coder. Moreover, in a known motion video decoder, decoding of a compressed video bit stream is performed via a series of steps that include variable length decoding, inverse scanning, inverse quantization, inverse discrete cosine transformation, and motion compensation.

In a known memory control scheme for inverse scanning, after completing the writing of a variable length decoded data block into a memory device in a zig-zag or alternate scan arrangement (hereinafter referred to as non-raster scan arrangement), the data block is then read from the memory device in a raster scan arrangement, thereby resulting in the initial data sequence of the data block prior to forward scanning in the motion video encoder. However, because writing of the next data block into the memory device begins only after reading of the previous data block in the memory device has been completed, idling of decoder stages in the motion video decoder is encountered, and too much time is required to complete inverse scanning of a single data block.

SUMMARY OF THE INVENTION

Therefore, the main object of the present invention is to provide a memory address generator with scheduled write and read address generating capability and suitable for use when rearranging data to overcome the aforesaid drawbacks of the prior art.

According to the present invention, a memory address generator with scheduled write and read address generating capability is adapted to generate write addresses to be used in writing data units of an input data block into a memory device in a non-raster scan arrangement according to a predetermined write sequence, and is adapted to generate read addresses to be used in reading the data units of the input data block from the memory device in a raster scan arrangement according to a predetermined read sequence so as to obtain a rearranged output data block. The memory address generator comprises:

a write address generator operable so as to generate the write addresses to be used in the writing of the data units of the input data block into the memory device in the non-raster scan arrangement;

a read address generator operable so as to generate the read addresses to be used in the reading of the data units of the input data block from the memory device in the raster scan arrangement; and a scan pattern analyzer coupled to the write and read address generators, the scan pattern analyzer comparing the write and read sequences, and enabling the read address generator after enabling the write address generator such that an optimum number of the write addresses for the writing of the input data block has been generated prior to generation of the read addresses for the reading of the input data block in order to ensure that the reading of each of the data units of the input data block from the memory device can lag the writing of each of the data units of the input data block into the memory device.

BRIEF DESCRIPTION OF THE DRAWINGS

Other features and advantages of the present invention will become apparent in the following detailed description of the preferred embodiment with reference to the accompanying drawings, of which:

FIG. 4 is a schematic circuit block diagram of the memory address generator of the preferred embodiment;

FIG. 6 is a table illustrating how first and second largest values are determined by the scan pattern analyzer of FIG. 5; and FIG. 7 illustrates how write and read address generation can be scheduled by the memory address generator of the preferred embodiment.

DETAILED DESCRIPTION OF THE PREFERRED EMBODIMENT

The memory address generator of this invention is adapted to generate write addresses to be used in writing data units of an input data block into a memory device in a non-raster scan arrangement, and to generate read addresses to be used in reading the data units of the input data block from the memory device in a raster scan arrangement so as to obtain a rearranged output data block. As such, the data units ($D_i$) are written into the memory device according to a predetermined write sequence (b) and are read from the memory device according to a predetermined read sequence (a). The memory address generator of this invention may be employed in applications that require data rearrangement, such as a motion video decoder.

Figure 1:
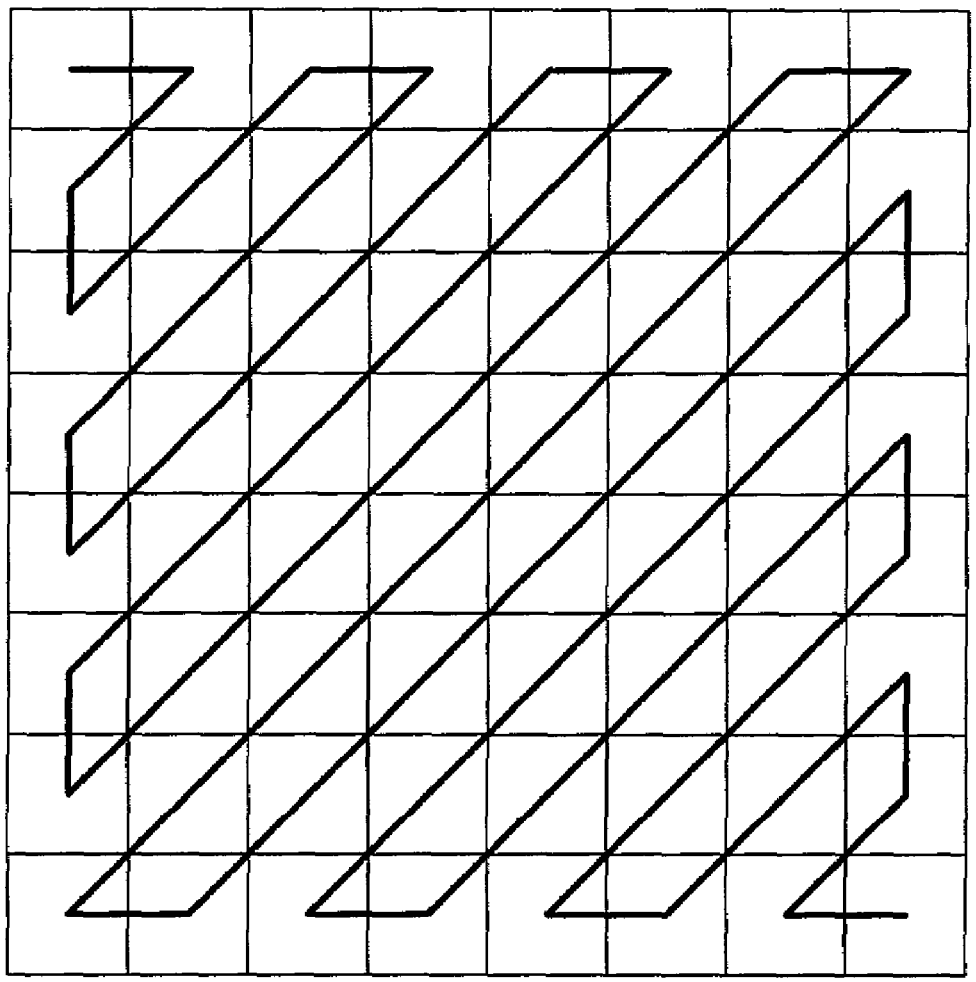
FIG. 1 illustrates a conventional zig-zag scanning operation.
Figure 2:
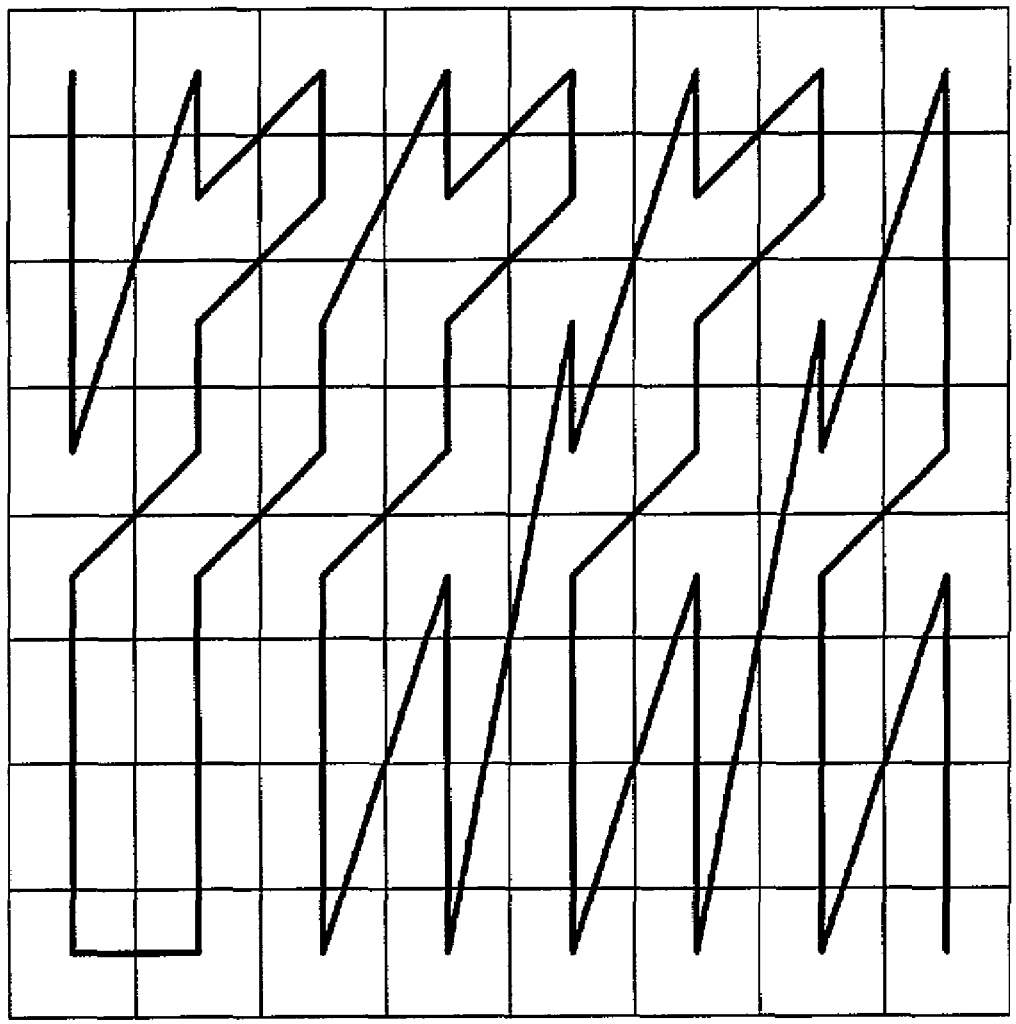
FIG. 2 illustrates a conventional alternate scanning operation.
Figure 3:
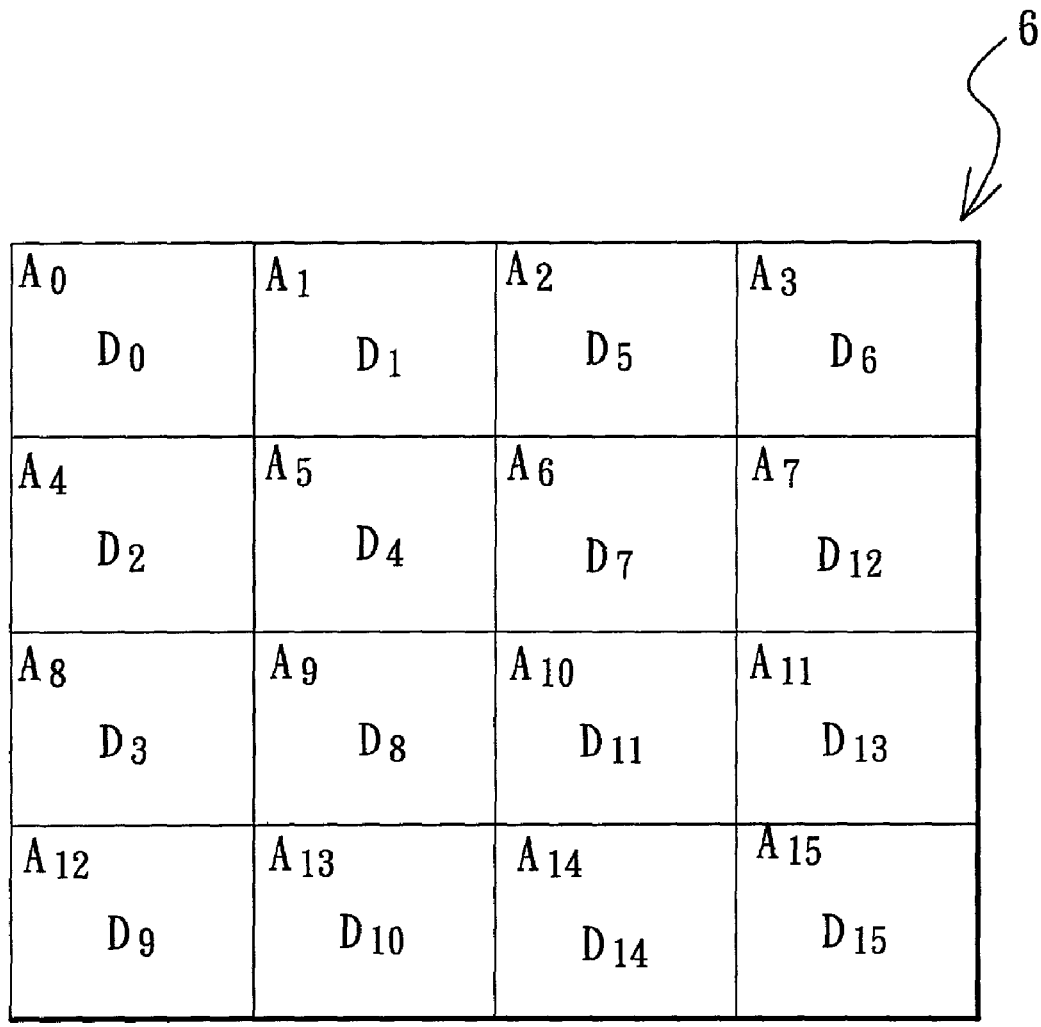
FIG. 3 illustrates how data units of an input data block are written into a memory device with the use of the preferred embodiment of a memory address generator according to the present invention.

In the following illustrative example, an input data block includes sixteen data units ($D_0$–$D_{15}$). The data units ($D_0$–$D_{15}$) are to be written into a memory device 6 having sixteen addressable locations ($A_0$–$A_{15}$), as best shown in FIG. 3. Since the data units ($D_0$–$D_{15}$) arrive in succession, the write sequence (b) of the data units ($D_0$–$D_{15}$) is 0, 1, 2, 3, 4, 5, 6, 7, 8, 9, 10, 11, 12, 13, 14, 15. In this example, the data units ($D_0$–$D_{15}$) are written into the memory device 6 in a zig-zag scan arrangement, with the locations of the memory device 6 being addressed in the following order: $A_0$, $A_1$, $A_4$, $A_8$, $A_5$, $A_2$, $A_3$, $A_6$, $A_9$, $A_{12}$, $A_{13}$, $A_{10}$, $A_7$, $A_{11}$, $A_{14}$, $A_{15}$, as shown in FIG. 3. The data units ($D_0$–$D_{15}$) are read from the memory device 6 in a raster scan arrangement, with the locations of the memory device 6 being addressed in the following order: $A_0$, $A_1$, $A_2$, $A_3$, $A_4$, $A_5$, $A_6$, $A_7$, $A_8$, $A_9$, $A_{10}$, $A_{11}$, $A_{12}$, $A_{13}$, $A_{14}$, $A_{15}$. Thus, the data units ($D_0$–$D_{15}$) are read from the memory device 6 in the following order: $D_0$, $D_1$, $D_5$, $D_6$, $D_2$, $D_4$, $D_7$, $D_{12}$, $D_3$, $D_8$, $D_{11}$, $D_{13}$, $D_9$, $D_{10}$, $D_{14}$, $D_{15}$, and the read sequence (a) of the data units ($D_0$–$D_{15}$) is 0, 1, 5, 6, 2, 4, 7, 12, 3, 8, 11, 13, 9, 10, 14, 15.

Referring to FIG. 4, the preferred embodiment of the memory address generator according to this invention is shown to comprise a scan pattern analyzer 3, a write address generator 4, and a read address generator 5.

In order for write and read operations to be performed during a single memory cycle, because a data unit has to be written into the memory device before it can be read from the same, reading of the data unit should not lead the writing of the same data unit, and writing of a data unit of a succeeding input data block in an addressable location of the memory device should not lead the reading of a data unit of a previous input data block stored in the same addressable location of the memory device. To this end, the scan pattern analyzer 3 is responsible for comparing the write and read sequences (b, a), and determines first and second optimum than a minimum number of the write addresses for the writing of the input data block that should have been generated before the read addresses for the reading of the same input data block are generated in order to ensure that the reading of each of the data units of the input data block can lag the writing of each of the data units of the input data block. The second optimum number is not less than a minimum number of the read addresses for the reading of the data units of a previous input data block that should have been generated before the write addresses for the writing of the data units of a succeeding input data block are generated in order to ensure that the reading of each of the data units of the previous input data block can lead overwriting of the same by one of the data units of the succeeding input data block.

In this embodiment, the scan pattern analyzer 3 subtracts each number in the write sequence (b) from a corresponding number in the read sequence (a). A positive result indicates that the read operation in the read sequence (a) leads the corresponding write operation in the write sequence (b), whereas a negative result indicates that the read operation in the read sequence (a) lags the corresponding write operation in the write sequence (b). The first optimum number is not less than the largest positive difference, whereas the second optimum number is not less than the absolute value of the largest negative difference. This will be explained in greater detail in the succeeding paragraphs.

Figure 5:
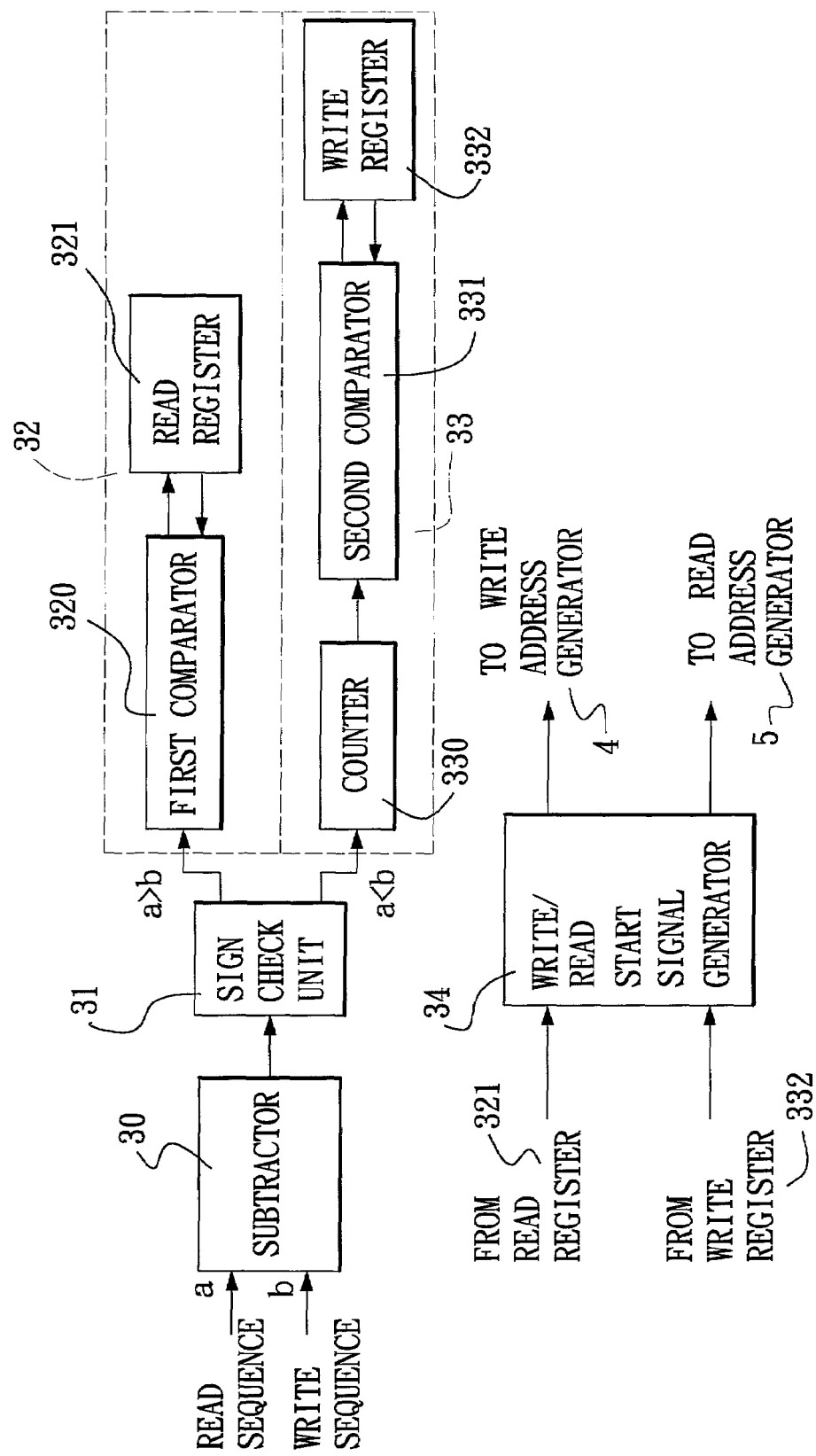
FIG. 5 is a schematic circuit block diagram illustrating a scan pattern analyzer of the memory address generator of the preferred embodiment.

Referring to FIG. 5, the scan pattern analyzer 3 includes a subtractor 30, a sign check unit 31, a first comparator unit 32, a second comparator unit 33, and a write/read start signal generator 34.

The subtractor 30 subtracts each number in the write sequence (b) from the corresponding number in the read sequence (a). In the illustrative example of FIG. 3, because the write sequence (b) is a uniformly incremented sequence, the write sequence (b) may be provided to the subtractor 30 by means of a counter 2 (see FIG. 4), which generates an incrementing count output from 0 to 15. The output (a–b) of the subtractor 30 in connection with the illustrative example of FIG. 3 is shown in FIG. 6. Preferably, the subtractor 30 adds a sign bit to its output to distinguish between a positive result and a negative result. More particularly, when the result is positive, the sign bit has a first logic value, such as 0, and when the result is negative, the sign bit has a second logic value, such as 1. The output (a–b) of the subtractor 30 is provided to the sign check unit 31.

The sign check unit 31 receives the output (a–b) of the subtractor 30 and, with reference to the sign bit, determines whether a present number in the read sequence (a) is greater than the corresponding number in the write sequence (b), i.e. a>b, or is less than the corresponding number in the write sequence (b), i.e. a<b. In the former case, the output (a–b) of the subtractor 30 is provided to the first comparator unit 32. In the latter case, the output (a–b) of the subtractor 30 is provided to the second comparator unit 33.

The first comparator unit 32 includes a first comparator 320 coupled to the sign check unit 31, and a read register 321 coupled to the first comparator 320. When the first comparator 320 receives the output (a–b) of the subtractor 30 from the sign check unit 31, it will compare the output (a–b) of the subtractor 30 with a current value stored in the read register 321. When the output (a–b) of the subtractor 30 is larger than the current value stored in the read register 321, the first comparator 320 will replace the current value stored in the read register 321 with the output (a–b) of the subtractor 30. Accordingly, when the output (a–b) of the subtractor 30 is not larger than the current value stored in the read register 321, the first comparator 320 will maintain the current value stored in the read register 320. Thus, with reference to FIG. 6, after comparing all sixteen numbers in the read sequence (a) with their corresponding numbers in the write sequence (b), the number "5" will be stored in the read register 321, which serves as a first largest value of the output (a–b) of the subtractor 30.

The second comparator unit 33 includes a converter 330 coupled to the sign check unit 31, a second comparator 331 coupled to the converter 330, and a write register 332 coupled to the second comparator 331. When the converter 330, such as a two's complement converter, receives the output (a–b) of the subtractor 30 from the sign check unit 31, it will obtain the absolute value of the output (a–b) and provide the same to the second comparator 331. When the second comparator 331 receives the output (a–b) from the converter 330, it will compare the output (a–b) from the converter 330 with a current value stored in the write register 332. When the output (a–b) from the converter 330 is larger than the current value stored in the write register 332, the second comparator 331 will replace the current value stored in the write register 332 with the output (a–b) from the converter 330. Accordingly, when the output (a–b) from the converter 330 is not larger than the current value stored in the write register 332, the second comparator 331 will maintain the current value stored in the write register 332. Thus, with reference to FIG. 6, after comparing all sixteen numbers in the read sequence (a) with their corresponding numbers in the write sequence (b), the number "5" will be stored in the write register 332, which serves as a second largest value of the output (a–b) of the subtractor 30.

The write/read start signal generator 34 is coupled to the read and write registers 321, 332, determines the first and second optimum numbers from the first and second largest values stored in the read and write registers 321, 332, and controls operations of the write address generator 4 and the read address generator 5 according to the first and second optimum numbers so that write and read addresses can be outputted during a single memory cycle without affecting integrity of the data units. In this embodiment, in order to ensure that write and read operations of the same data unit do not overlap, the start signal generator 34 determines the first optimum number to be one more than the first largest value stored in the read register 321 and further determines the second optimum number to be one more than the second largest value stored in the write register 332.

Upon determining the first and second optimum numbers, the start signal generator 34 will generate a write start signal for enabling the write address generator 4 to generate the write addresses for writing the data units of the input data block in a non-raster scan arrangement, such as the zig-zag scan arrangement in the illustrative example of FIG. 3. In this embodiment, the write address generator 4 includes an accumulator 41 and a scan conversion table 42. The accumulator 41 is enabled by the write start signal to generate a uniformly incremented output that is incremented from 0 to 15 for each write cycle of the memory device 6. The scan conversion table 42 stores a scan address pattern corresponding to the non-raster scan arrangement, and outputs a write address corresponding to the output of the accumulator 41 for each write cycle of the memory device 6. As such, the data units of the input data block can be written in the non-raster scan arrangement according to the scan address pattern of the scan conversion table 42, as best shown in FIG. 3.

The start signal generator 34 further generates a read start signal for enabling the read address generator 5 to generate the read addresses for reading the data units in the memory device in a raster scan arrangement upon determination by the start signal generator 34 that the first optimum number of the write addresses has been generated by the write address generator 4. In this embodiment, the read address generator 5 includes a counter 51 that is enabled by the read start signal to generate a uniformly incremented read address output that is incremented from 0 to 15 for each read cycle of the memory device 6. As such, in the illustrative example of FIG. 3, the data units of the input data block can be read in the raster scan arrangement after the sixth data unit ($D_5$) has been written into the memory device.

Moreover, the start signal generator 34 will generate a next write start signal for enabling the write address generator 4 to generate the write addresses for writing the data units of a succeeding input data block in a non-raster scan arrangement upon determination by the start signal generator 34 that the second optimum number of the read addresses have been generated by the read address generator 5. Thus, in the illustrative example of FIG. 3, the data units of the succeeding input data block are written into the memory device 6 only after the data unit ($D_4$) has been read from the memory device 6.

When the write and read addresses are simultaneously generated by the write and read address generators 4, 5, write and read cycles can be alternated during a single memory cycle while maintaining integrity of the data units. The time required to complete inverse scanning of a single input data block is shortened, and idling of decoder stages when the present invention is applied to a motion video decoder can be minimized. Moreover, the memory address generator of this invention can be configured to suit different sizes of input data blocks and different non-raster scan arrangements.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A memory address generator with scheduled write and read address generating capability, said memory address generator being adapted to generate write addresses to be used in writing data units of an input data block into a memory device in a non-raster scan arrangement according to a predetermined write sequence, and being adapted to generate read addresses to be used in reading the data units of the input data block from the memory device in a raster scan arrangement according to a predetermined read sequence so as to obtain a rearranged output data block, said memory address generator comprising:

a write address generator operable so as to generate the write addresses to be used in the writing of the data units of the input data block into the memory device in the non-raster scan arrangement;

a read address generator operable so as to generate the read addresses to be used in the reading of the data units of the input data block from the memory device in the raster scan arrangement; and a scan pattern analyzer coupled to said write and read address generators, said scan pattern analyzer comparing the write and read sequences, and enabling said read address generator after enabling said write address generator such that a first optimum number of the write addresses for the writing of the input data block has been generated prior to generation of the read addresses for the reading of the input data block in order to ensure that the reading of each of the data units of the input data block from the memory device lags the writing of each of the data units of the input data block into the memory device.

2. The memory address generator as claimed in claim 1, wherein said scan pattern analyzer comprises:

a subtractor for subtracting each number in the write sequence from a corresponding number in the read sequence;

a sign check unit coupled to said subtractor, said sign check unit receiving output of said subtractor and determining a sign associated with the output of said subtractor;

a first comparator unit coupled to said sign check unit, said first comparator unit receiving the output of said subtractor from said sign check unit upon determination by said sign check unit that a present number in the read sequence is greater than the corresponding number in the write sequence, and determining a first largest value of the output of said subtractor; and a write/read start signal generator coupled to said first comparator unit, said write address generator and said read address generator, said start signal generator determining the first optimum number from the first largest value determined by said first comparator unit, generating a write start signal for enabling operation of said write address generator, and further generating a read start signal for enabling operation of said read address generator, the read start signal being generated by said start signal generator upon determination by said start signal generator that the first optimum number of the write addresses has been generated by said write address generator.

3. The memory address generator as claimed in claim 2, wherein the first optimum number is one more than the first largest value determined by said first comparator unit.

4. The memory address generator as claimed in claim 2, wherein said first comparator unit includes a read register coupled to said start signal generator, and a first comparator coupled to said sign check unit and said read register, said first comparator receiving the output of said subtractor from said sign check unit upon determination by said sign check unit that the present number in the read sequence is greater than the corresponding number in the write sequence, said first comparator comparing the output of said subtractor with a current value stored in said read register, and replacing the current value stored in said read register with the output of said subtractor when the output of said subtractor is larger than the current value stored in said read register, whereby the first largest value is stored in said read register after said scan pattern analyzer has compared each number in the write sequence with the corresponding number in the read sequence.

5. The memory address generator as claimed in claim 2, wherein said scan pattern analyzer further enables said write address generator such that a second optimum number of the read addresses for the reading of the data units of a previous input data block from the memory device has been generated prior to generation of the write addresses for the writing of the data units of a succeeding input data block into the memory device in order to ensure that the reading of each of the data units of the previous input data block from the memory device can lead overwriting of each of the data units of the previous input data block by one of the data units of the succeeding input data block.

6. The memory address generator as claimed in claim 5, wherein said scan pattern analyzer further comprises:
   a second comparator unit coupled to said sign check unit, said second comparator unit receiving the output of said subtractor from said sign check unit upon determination by said sign check unit that the present number in the read sequence is less than the corresponding number in the write sequence, and determining a second largest value of the output of said subtractor;
   said write/read start signal generator being further coupled to said second comparator unit, and further determining the second optimum number from the second largest value determined by said second comparator unit, said start signal generator generating the write start signal for enabling said write address generator to generate the write addresses for the data units of the succeeding input data block upon determination by said start signal generator that the second optimum number of the read addresses has been generated by said read address generator.

7. The memory address generator as claimed in claim 6, wherein the second optimum number is one more than the second largest value determined by said second comparator unit.

8. The memory address generator as claimed in claim 6, wherein said second comparator unit includes a converter coupled to said sign check unit, a write register coupled to said start signal generator, and a second comparator coupled to said converter and said write register,
   said converter receiving the output of said subtractor from said sign check unit upon determination by said sign check unit that the present number in the read sequence is less than the corresponding number in the write sequence, said converter providing an absolute value of the output of said subtractor to said second comparator,
   said second comparator comparing the output of said subtractor received from said converter with a current value stored in said write register, and replacing the current value stored in said write register with the output of said subtractor that was received from said converter when the output of said subtractor is larger than the current value stored in said write register, whereby the second largest value is stored in said write register after said scan pattern analyzer has compared each number in the write sequence with the corresponding number in the read sequence.

* * * * *